(12) United States Patent
Tao

(10) Patent No.: US 7,683,593 B2
(45) Date of Patent: Mar. 23, 2010

(54) CURRENT SENSING IN A POWER CONVERTER

(75) Inventor: Hai Tao, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 427 days.

(21) Appl. No.: 11/606,449

(22) Filed: Nov. 30, 2006

(65) Prior Publication Data
US 2008/0130330 A1    Jun. 5, 2008

(51) Int. Cl.
G05F 1/573 (2006.01)
G05F 1/40 (2006.01)
(52) U.S. Cl. .................................... 323/277; 323/284
(58) Field of Classification Search ................ 323/313, 323/314, 316, 274–280, 282, 284
See application file for complete search history.

(56) References Cited

U.S. PATENT DOCUMENTS 6,801,030 B2 * 10/2004 Tai et al. .................... 323/316
7,180,271 B2 * 2/2007 Takahashi et al. ............. 322/28

OTHER PUBLICATIONS

C. F. Lee et al., "A Monolithic Current-Mode CMOS DC-DC Converter With On-Chip Current-Sensing Technique," IEEE Journal of Solid-State Circuits, vol. 39, No. 1, Jan. 2004, pp. 3-14.

* cited by examiner

Primary Examiner—Jessica Han
(74) Attorney, Agent, or Firm—Sidley Austin LLP

(57) ABSTRACT

In one embodiment, a power converter system includes a power device coupled between a first node and second node. The power device is operable to be turned on and off by a control signal. Current flows through the power device when the power device is turned on for delivering power to a load. A sensing circuit is coupled in parallel to the power device between the first node and the second node. The sensing circuit is operable to develop a signal indicative of the current flowing through the power device and is further operable to be turned on and off by the same control signal as for the power device. The sensing circuit turns on when the power device turns on and turns off when the power device turns off.

25 Claims, 4 Drawing Sheets

CURRENT SENSING IN A POWER CONVERTER

BACKGROUND

1. Field of Invention

The present invention relates to power conversion, and more particularly, to current sensing in a power converter.

2. Description of Related Art

Power converters are essential for many modern electronic devices. Among other capabilities, power converters can adjust voltage level downward (buck converter) or adjust voltage level upward (boost converter). Power converters may also convert from alternating current (AC) power to direct current (DC) power, or vice versa. Power converters are typically implemented using one or more switching devices, such as transistors, which are turned on and off to deliver power to the output of the converter. Control circuitry is provided to regulate the turning on and off of the switching devices, and thus, these converters are known as "switching regulators" or "switching converters." The power converters may also include one or more capacitors or inductors for alternately storing and outputting energy.

In a power converter, accurately sensing the output current can be of great importance. For example, in current-mode controllers, the output current can be used as the feedback input to the controller, making it an essential part of the control loop. Information about the output current can also be used for protection, for example, to protect the output inductor from saturation or to prevent overheating of the power devices. As power converters run at higher frequencies to reduce passive sizes and increase transient response time, sensing or detecting the output current becomes more and more challenging.

In particular, the current sensing must be accurate, fast, and not introduce or cause transient dependant error signals. That is, the current sensing accuracy needs to be preserved over variations in device process, supply voltage, and temperature (PVT). The sensing scheme should be fast—i.e. wide band in order keep up with the higher operating frequency of the modern power converters. Finally, because the power switch in a power converter turns on and off every clock cycle, the sensing circuitry needs to turn on and off equally fast, and behave well doing so without introducing transient dependant error signals.

SUMMARY

According to an embodiment of the present invention, a power converter system is provided. The power converter system includes a power device coupled between a first node and second node. The power device is operable to be turned on and off by a control signal. Current flows through the power device when the power device is turned on for delivering power to a load. A sensing circuit is coupled in parallel to the power device between the first node and the second node. The sensing circuit is operable to develop a signal indicative of the current flowing through the power device and is further operable to be turned on and off by the same control signal as for the power device. The sensing circuit turns on when the power device turns on and turns off when the power device turns off.

According to another embodiment of the present invention, in a power converter system having a power device operable to be turned on and off by a control signal for delivering power to a load, a method is provided for sensing current flow through the power device. The method includes: providing a sensing circuit coupled in parallel to the power device; turning on the sensing circuit when the power device turns on; developing a signal indicative of the current flowing through the power device using the sensing circuit when the power device is turned on; and turning off the sensing circuit when the power device turns off.

Important technical advantages of the present invention are readily apparent to one skilled in the art from the following figures, descriptions, and claims.

BRIEF DESCRIPTION OF DRAWINGS

For a more complete understanding of the present invention and for further features and advantages, reference is now made to the following description taken in conjunction with the accompanying drawings.

DETAILED DESCRIPTION

Embodiments of the present invention and their advantages are best understood by referring to FIGS. 1 through 6 of the drawings. Like numerals are used for like and corresponding parts of the various drawings.

In various embodiments, the present invention provides or implements improved techniques to sense the instantaneous current in the power device of a power converter system (such as a DC-DC converter) with high-precision, high speed, and good transient on-off behavior. Unlike some previously developed techniques, techniques according to embodiments of the present invention do not require a precision sense resistor, can operate at high speed, and have good transient behavior which makes them well-suited for high-frequency power conversion. The current sensing techniques of various embodiments can be used for a variety of functions or features, such as, for example, current mode control or current protection in the power converter system.

In one embodiment, sensing circuitry makes use of the inherent properties of two transistors (e.g., MOSFETs) in series connection and in triode mode to accurately sense or develop a signal indicative or representative of current in the power device. At least one of the transistors can also act as a switch to automatically turn off the sensing circuitry when the power device turns off, for example, being controlled by the same signal as the power device. As such, the sensing circuitry does not require additional control signaling as previously developed designs. Furthermore, with another feature, when the power device is off, the internal voltage of the sensing circuitry does not deviate far from normal operating value, so fast turn-on of the sensing circuitry is possible, with well-behaved transient response.

Figure 1:
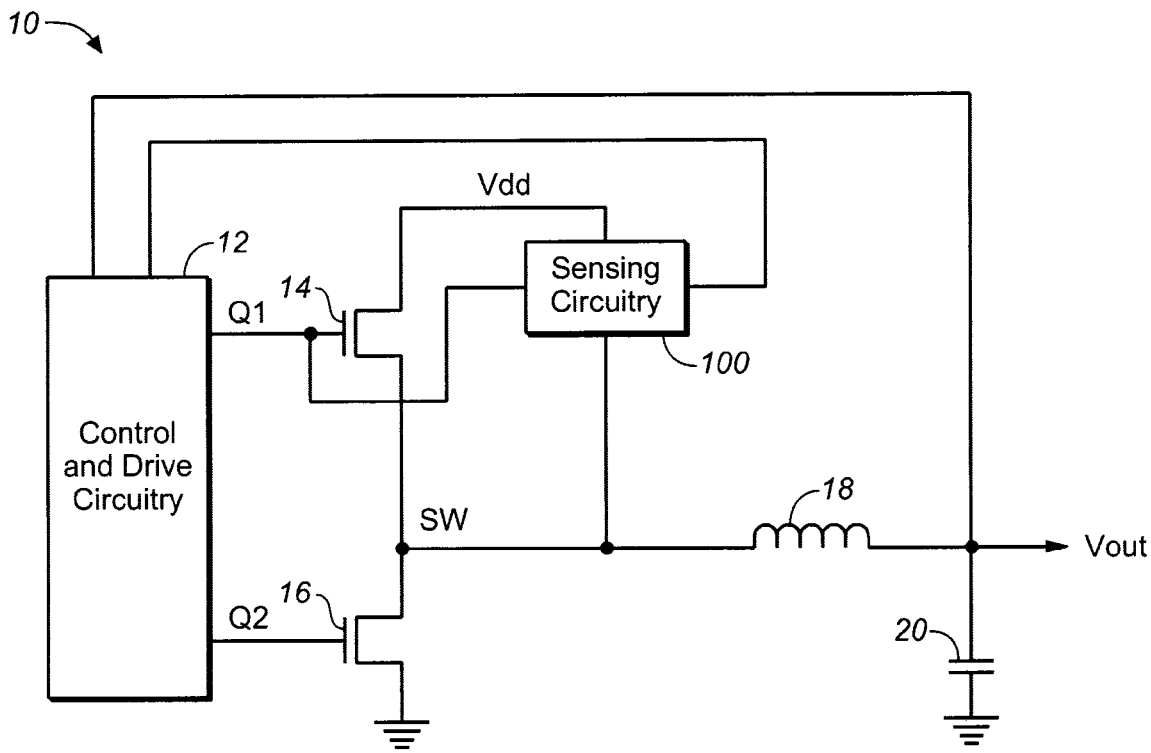
FIG. 1 is a block diagram of power converter system having circuitry for improved current sensing, according to an embodiment of the invention.

FIG. 1 is a block diagram of a power converter system 10 having circuitry 100 for improved current sensing, according to an embodiment of the invention. In this embodiment, power converter system 10 is a switching regulator and can provide a direct current (DC) power. Power converter system 10 can be incorporated in or used with any electronic device in which a DC-to-DC converter as described herein is needed. Power converter system 10 receives an input voltage Vin (as Vdd) and provides the DC power to a load at an output terminal Vout. In one embodiment, power converter system 10 can be a synchronous buck converter which convert a voltage at a higher level (e.g., 5V) to a voltage at a lower level (e.g., 1V). In other embodiments, power converter system 10 can be a boost or buck-boost converter (not shown). Upon reading this disclosure, a skilled artisan can understand how to implement the present invention without undue experimentation. As shown, power converter system 10 also includes control and drive circuitry 12, switches 14 and 16, an inductor 18, and an output capacitor 20.

The inductor 18 is coupled to the output capacitor 20 at the output terminal Vout of the power converter system 10. As used herein, the terms "coupled" or "connected," or any variant thereof, covers any coupling or connection, either direct or indirect, between two or more elements. Output capacitor 20 absorbs the transient current flowing through the inductor 18, and provides a smoothed DC voltage at the output node Vout to the intended load.

Switches 14 and 16 are coupled to the inductor 18. As shown, switches 14 and 16 are connected at a switching node (SW) in a half-bridge arrangement, with switch 14 being the "high-side" switch and switch 16 being the "low-side" switch. The high-side switch 14 may be connected between the input voltage Vin (Vdd) and node SW. The high-side switch 14 may be considered the power switch or device for power converter system 10. Switch 14 is turned on and off to ramp up and down the current of inductor 18, thus controlling or regulating the output voltage Vout at the output terminal of power converter system 10. The low-side switch 16 may be connected between the node SW and ground (GND), and provides or supports synchronous rectification. For synchronous rectification, the low-side switch 16 is turned off during the "charge" cycle for inductor 18 when high-side switch 14 is turned on, and turned on when switch 14 turns off, as current in inductor 18 continues to flow into capacitor 20, as well as to the intended load. Each of the two switches 14, 16 can be implemented with any suitable device, such as, for example, a metal-oxide-semiconductor field effect transistor (MOSFET), an IGBT, a MOS-gated thyristor, or other suitable power device. Each switch 14 and 16 has a gate to which a respective driving voltage or control signal (Q1, Q2) may be applied to turn the switch on or off.

Control and drive circuitry 12 are coupled to the gates of switches 14 and 16, and provides control signals Q1, Q2 for turning on and off the switches. Control and drive circuitry 12 may coupled to the output terminal to receive the output voltage Vout as a feedback signal.

Sensing circuitry 100 generally functions to provide a signal Isense which is indicative or representative of the current flowing through the power switch or device 14. The Isense signal can be used as feedback input to the control and drive circuitry 12 for power devices 14 and 16, thus making it useful in the control loop (e.g., current mode control) for power converter system 10. The sensed current Isense can also be used for protection, for example, to protect output inductor 18 from saturation or to prevent overheating of the power device 14.

In other embodiments (not shown), additional sensing circuitry can be coupled to the low-side switch 16 to provide or generate a signal indicative or representative of the current flowing through the synchronous rectifier. Such signal can also be used for a variety of purposes, such as, for example, control.

In various embodiments, all or a portion of power converter system 10 can be implemented on a single or multiple semiconductor dies (commonly referred to as a "chip") or discrete components. Each die is a monolithic structure formed from, for example, silicon or other suitable material. For implementations using multiple dies or components, the dies and components can be assembled either on a shared package to make a module, or on a printed circuit board (PCB) having various traces for communicating signals therebetween. In one embodiment, for example, an integrated DC-DC buck converter with integrated current sensing 100 and power devices 14 and 16, as well as controller 12, can be implemented on a single chip or die, and remaining elements, such as inductor 18 and capacitor 20, implemented as discrete components on the PCB.

Figure 2:
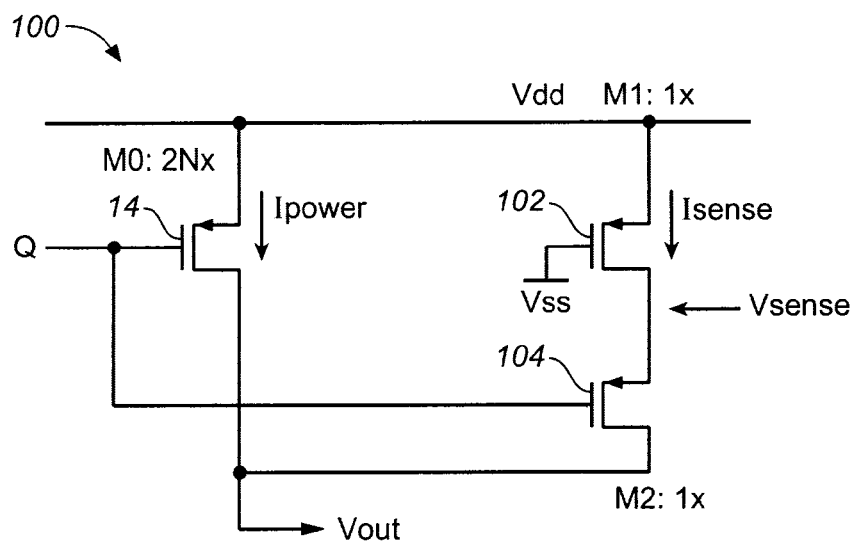
FIG. 2 is a block diagram of an exemplary implementation of circuitry for improved current sensing, according to an embodiment of the invention.

FIG. 2 is a block diagram of an exemplary implementation of sensing circuitry 100 for improved current sensing, according to an embodiment of the invention. Sensing circuitry 100 can be used with power device 14. Sensing circuitry 100 and power device 14 may be incorporated in a power converter system, such as shown in FIG. 1.

Power device 14 is coupled between the input voltage Vdd and an output terminal Vout (which can be, for example, the SW node in power converter system 10). Power device 14 has a terminal (e.g., gate) to which driving voltage or control signal Q may be applied to turn the power device 14 on and off, thus controlling or regulating the voltage at the output terminal Vout.

Sensing circuitry 100 generates or provides signal Isense which is indicative or representative of the current flowing in the power device 14 when it is turned on. In one embodiment, the sensing circuitry 100 will turn on when power device 14 turns on, and will turn off when the power device 14 turns off. As shown, sensing circuitry 100 includes transistors 102 and 104, which are connected in series with each other. Together, transistors 102 and 104 are connected in parallel with power device 14 between Vdd and Vout. In one embodiment, the transistors 102 and 104 are implemented as equally-sized MOSFETS (e.g., of the PMOS type). The size of transistors 102 and 104 may be matched to and can be a small fraction (e.g., one-hundredth) that of power device 14. The gate of transistor 102 is connected (e.g., to ground) so that it is always on. The gate of transistor 104 receives the same control signal Q as the power device 14. When power device 14 is turned on, transistor 104 turns on; when power device 14 is turned off, transistor 104 turns off. The current flowing through transistors 102 and 104 is the intended sensed current (Isense) and the voltage at the drain of transistor 102 (which is connected to the source of transistor 104) is a sensed voltage Vsense, which can be one-half of the voltage drop across the power-device M14.

In operation, when the control signal Q is low, both the power device 14 and the sensing circuitry 100 (comprising transistors 102 and 104) turn on. All three transistors are in triode state, having the same gate voltage. The drain-to-source voltage (Vds) of power device 14 is equal to the sum of the Vds of transistor 102 and the Vds of transistor 104. Under these conditions, if the small body effect of transistor 104 is ignored (which can be also eliminated by connecting the n-well of transistor 104 to its source), then the sensed current Isense will have a value given by the following equation:

$$Isense = IM1 = IM2 = Ipower/N$$

where IM1 is the current flowing through transistor 102, IM2 is the current flowing through transistor 104, Ipower is the current flowing through power device 14, and N is the size ratio between the power device 14 and the total size of devices 102 and 104 (e.g., if power device 14 is one hundred times as large as the total size of transistors 102 and 104, then N=100). Thus, the sensed current Isense has magnitude which is a fraction (e.g., one-hundredth) of that of the current of the power device 14. This relationship holds regardless of variations in the process, supply voltage, or temperature (PVT) as long as the size ratio of power device 14 and transistors 102 and 104 holds. Since the sensed current (Isense) can be substantially smaller than the power device current (Ipower), sensing circuitry 100 provides for efficient operation.

When the control signal Q is high, power device 14 turns off. Similarly, because the gate of transistor 104 in the sensing circuitry 100 is also high, sensing circuitry 100 turns off as well. As such, the sensed current Isense flowing through transistors 102 and 104 in sensing circuitry 100 goes down to zero automatically, thus not consuming any power when it is not needed. The sensing circuitry 100 operates with the same control signal (e.g., Q) as the power device 14. Thus, no additional control signals are necessary to shut down or operate the sensing circuitry 100.

The sensing circuitry 100 provides advantages over previously developed designs, making it suitable for high-precision, high frequency operations. For example, the ratio of the sensed current (Isense) to the power device current (Ipower) only depends on geometry matching between power device 14 and transistors 102 and 104 of the sensing circuitry 100, and is thus not dependant on PVT variations. This makes Isense an accurate and repeatable indicator or representation for the current Ipower flowing through power device 14.

Another advantage of the sensing circuitry 100 is that it does not experience the large current spikes associated with the power device 14. In particular, the drain voltage of the transistor 102 experiences only small swings in voltage (e.g., moving from Vdd-Vds to Vdd between on and off, typically in the range of a few tens of millivolts up to a few hundred millivolts). This is more than an order of magnitude less than the voltage swing at the output node Out (i.e., the drain of power device 14) which goes from supply voltage Vdd to zero (e.g., in the range of a few voltage to tens of voltages). Therefore, the Isense current does not contain the erroneous current spike associated with charging and discharging the output node Out. Furthermore, since transistor 102 is always on, the node Vsense is not required to slew a large voltage when transistor 104 is turned on from an off state, thus allowing the sensing circuitry 100 to be turned on and off more rapidly.

Figure 5:
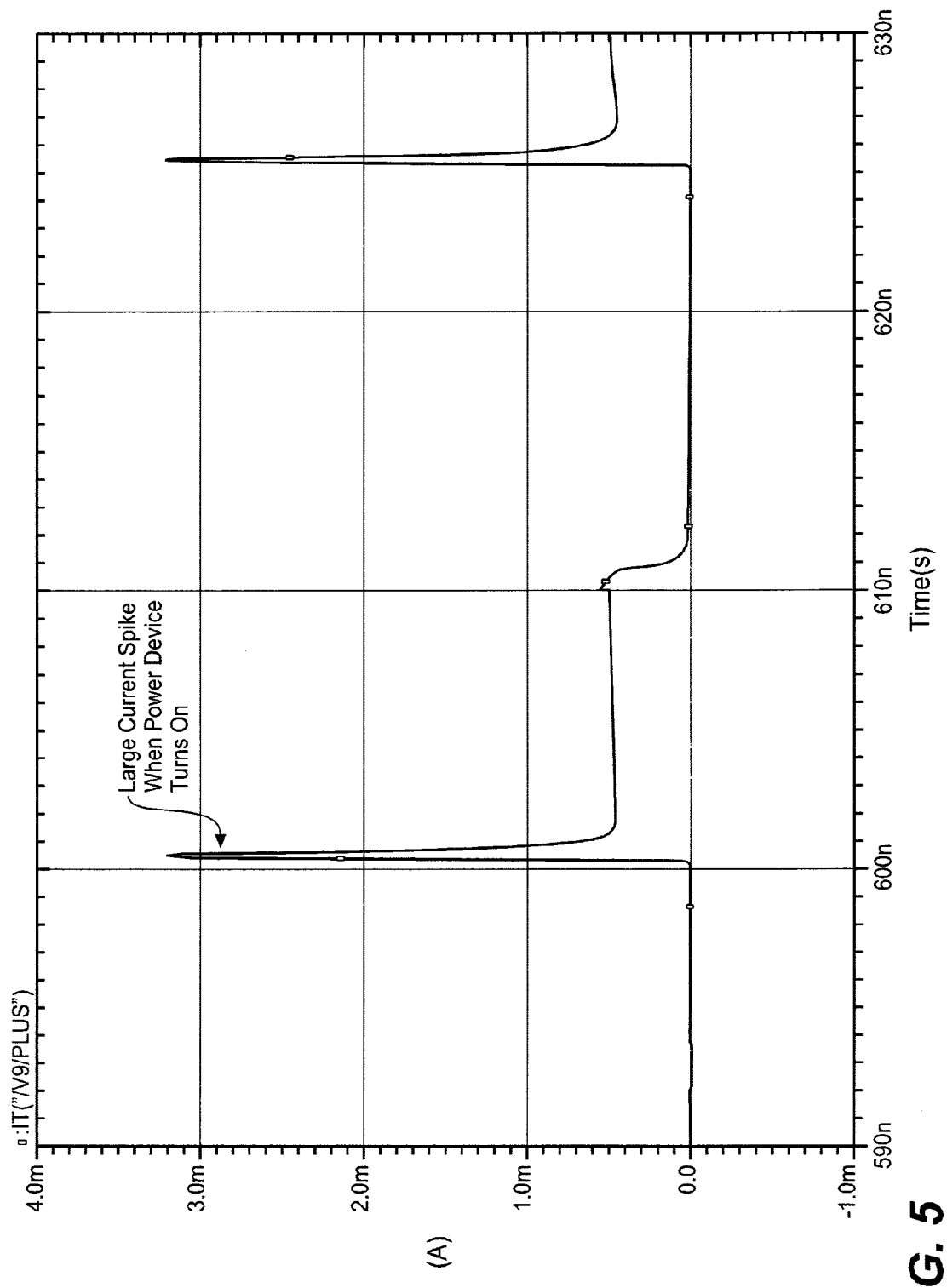
FIG. 5 is an exemplary waveform diagram representing the sensed current flowing through a power device using a conventional technique.
Figure 6:
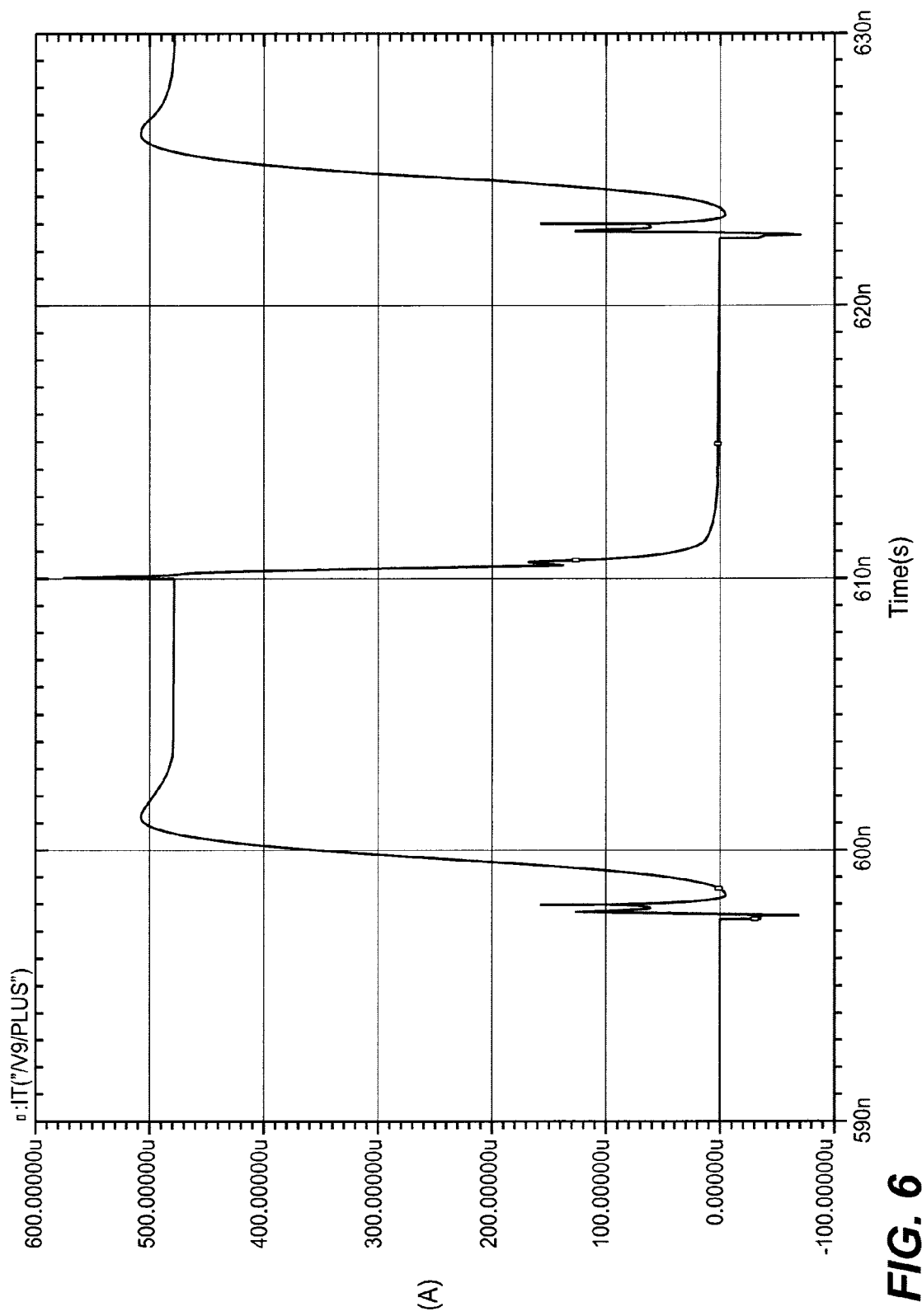
FIG. 6 is an exemplary waveform diagram representing the sensed current flowing through a power device using an embodiment of the invention.

This improvement in transient behavior over prior techniques is illustrated by comparing the sensed-current waveform developed by a conventional technique (as shown in FIG. 5), and the current waveform developed by an embodiment of the present invention (as shown in FIG. 6). The current waveform shown in FIG. 5 exhibits a large spike, which is larger than the magnitude of the intended current. In contrast, the current waveform in FIG. 6 does not show such a large spike, making it a more accurate for current sensing.

In addition, comparing the starting time of the sensed current waveforms, FIG. 6 shows a starting time earlier than that in FIG. 5, thus illustrating that the current-sensing method according to an embodiment of the present invention is faster (less delay) in that using a conventional method.

Figure 3:
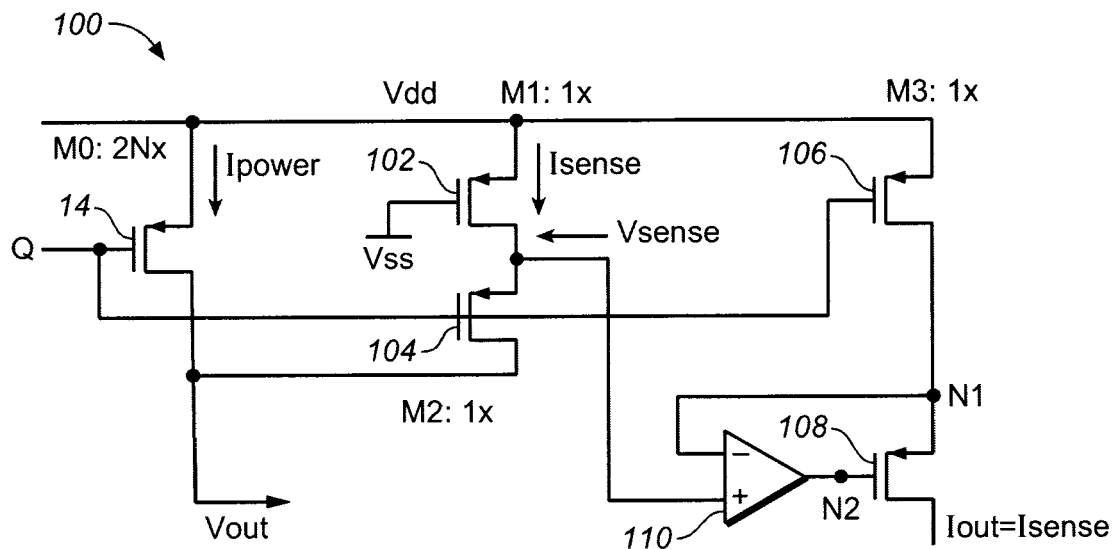
FIG. 3 is a block diagram of another exemplary implementation of circuitry for improved current sensing, according to an embodiment of the invention.

FIG. 3 is a block diagram of an exemplary implementation of sensing circuitry 100 for improved current sensing, according to an embodiment of the invention. Like the implementation shown in FIG. 2, the implementation for sensing circuitry 100 shown in FIG. 3 includes transistors 102 and 104, which are connected in series with each other, and together are connected in parallel with power device 14 between Vdd and Vout. In addition, this implementation for sensing circuitry 100 includes transistors 106, 108 and operational amplifier 110.

Transistors 106 and 108 are connected in series with each other. Transistor 106 is coupled the input Vdd at one end and to a node N1 at the other end. Transistor 108 is coupled to node N1 at one end and the sensed-current output node, Iout, at the other end. In one embodiment, the transistors 106 and 108 are implemented as P type MOSFETS. Like transistors 102, 104, the size of transistors 106, 108 may be matched to and can be a fraction that of power device 14. The gate of transistor 106 receives the same control signal Q as the power device 14 and transistor 104. The gate of transistor 108 is connected to receive the output from operational amplifier 110 at node N2. Operational amplifier 110 is coupled to receive the Vsense signal at its non-inverting (+) input and is coupled to node N1 at its inverting (−) input.

Transistors 106, 108 and operational amplifier 110 implement a current mirror circuit, which functions to mirror the sensed current Isense. That is, the current mirror circuit develops a current Iout, which is proportional to Isense. In one embodiment, the magnitude of Iout may be the same as the magnitude of Isense (i.e., Iout=Isense). The current mirror circuit can exhibit the same transient behavior as the current sensing circuitry implemented by transistors 102 and 104. When power device 14 turns off, node Vsense goes up to Vdd. The operational amplifier 110 will drive the drain node of transistor 106 up to Vdd as well, while the output node of the operational amplifier 110 stays at approximately Vdd-Vgs. The sensed output current Iout naturally goes down to zero without introducing any glitches. Because all three internal nodes of the current mirror circuit (i.e., Vsense, N1, and N2) stay close to their normal operating voltages, the current mirror circuit can be turned on rapidly when the power device 14 turns on for the next cycle. During this turn-on transient, no large spike current will be generated since none of the internal nodes need to be charged or discharged to slew a large voltage.

Figure 4:
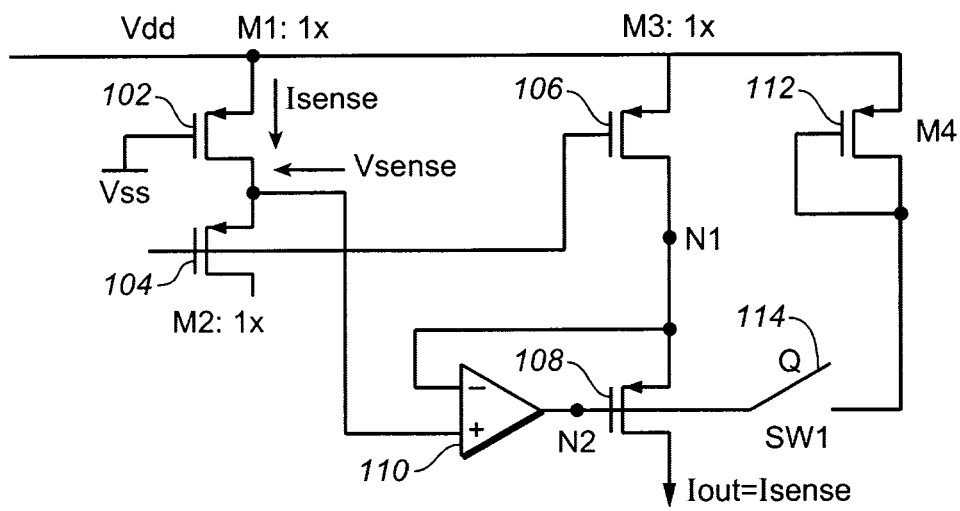
FIG. 4 is a block diagram of another exemplary implementation of circuitry for improved current sensing, according to an embodiment of the invention.

FIG. 4 is a block diagram of another exemplary implementation of sensing circuitry 100 for improved current sensing, according to an embodiment of the invention. Like the implementation shown in FIG. 3, the implementation for sensing circuitry 100 shown in FIG. 4 includes transistors 102, 104, 106, 108, and operational amplifier 110. In addition, this implementation for sensing circuitry 100 includes transistor 112 and switch 114.

The output of certain types of operational amplifier might go to an unknown state when both inputs are coupled to Vdd. If operational amplifier 110 is of this type, switch 114 can be added to clamp its output, as shown in FIG. 4. Switch 114 may couple the output node of the operational amplifier 110 to a known bias point which, for example, can be generated or provided by transistor 112. Switch 114 is responsive to the control signal Q. When the Q control signal is high (and power device 14 is turned off), the switch 114 closes, forcing the voltage at output node of the operational amplifier 110 to stay close to the intended operating point. This ensures that the operational amplifier's output node does not deviate from the operating voltage, thus preserving the fast turn-on characteristic of the sensing circuitry 100. Switch 114 can be made from a N-type MOSFET.

As described herein, embodiments of the present invention provide or implement a technique to sense current in the power device of a power converter system with high precision, fast speed, and good transient behavior. Compared to previously developed designs, embodiments of the present invention can offer the numerous advantages. For example, an accurate indicator or representation of the current flowing in the power device can be achieved by geometrical matching of devices, and can be independent of PVT variations. Also, the current sensing circuitry can have fast operating speed and fast turn-on and turn-off because no internal nodes need to slew a large voltage. The current sensing technique may exhibit good transient behavior (e.g., no transient spikes in current, which can be large compared to the intended sense current and highly PVT dependant). The current sensing technique introduces no or minimal loss in efficiency, as no sense resistor is inserted in series with the power device. In addition, some embodiments can be low power because the current of the sensing circuitry goes to the load (excluding that of the current mirror).

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A power converter system comprising:
   a power device coupled between a first node and second node, the power device operable to be turned on and off by a control signal, wherein current flows through the power device when the power device is turned on for delivering power to a load; and
   a sensing circuit coupled in parallel to the power device between the first node and the second node, the sensing circuit operable to develop a signal indicative of the current flowing through the power device and further operable to be turned on and off by the same control signal as for the power device, wherein the sensing circuit turns on when the power device turns on and turns off when the power device turns off.

2. The power converter system of claim 1, wherein sensing circuit comprises:
   a first switching device coupled between the first node and a third node, wherein the first switching device remains turned on during operation of the power converter system; and
   a second switching device coupled in series with the first switching device between the third node and the second node, the second switching device turned on and off by the same control signal as for the switching device.

3. The power converter system of claim 2, wherein power device, the first switching device, and the second switching device are in triode mode when the power device and the sensing circuit are turned on.

4. The power converter system of claim 2, wherein a size ratio between each of the first and second switching and the power device is predetermined.

5. The power converter system of claim 2, wherein the signal indicative of the current flowing through the power device comprises a current flowing through the first and second switching devices.

6. The power converter system of claim 1, wherein the sensing circuit is implemented on an integrated circuit device.

7. The power converter system of claim 1, wherein the power device and the sensing circuit are implemented on an integrated circuit device.

8. The power converter system of claim 1, wherein the sensing circuit comprises a switching device, wherein a size ratio between the switching device of the sensing circuit and the power device is predetermined.

9. The power converter system of claim 8, wherein the power device and the switching device are geometrically matched.

10. In a power converter system having a power device operable to be turned on and off by a control signal for delivering power to a load, a method for sensing current flow through the power device, the method comprising:
    providing a sensing circuit coupled in parallel to the power device;
    turning on the sensing circuit when the power device turns on;
    developing a signal indicative of the current flowing through the power device using the sensing circuit when the power device is turned on; and
    turning off the sensing circuit when the power device turns off.

11. The method of claim 10 wherein the power device is coupled between a first node and second node, and wherein the sensing circuit comprises:
    a first switching device coupled between the first node and a third node, wherein the first switching device remains turned on during operation of the power converter system;
    a second switching device coupled in series with the first switching device between the third node and the second node, the second switching device turned on and off by the same control signal as for the switching device.

12. The method of claim 11, comprising maintaining the power device, the first switching device, and the second switching device in triode mode when the power device and the sensing circuit are turned on.

13. The method of claim 11, wherein the signal indicative of the current flowing through the power device comprises a current flowing through the first and second switching devices.

14. The method of claim 10, wherein at least one of the power device and the sensing circuit are implemented on an integrated circuit device.

15. The method of claim 10, wherein the sensing circuit comprises a switching device, wherein a size ratio between the switching device of the sensing circuit and the power device is predetermined.

16. The method of claim 10, wherein the power device and the switching device are geometrically matched.

17. A power converter system for providing power to a load, the power converter system comprising:
    a regulated output terminal at which the load can be connected;

a power device operable to be turned on and off with a control signal, the power device coupled between a first node and a second node;

an inductor coupled between the second node and the output terminal through which current flows to the regulated output terminal; and a sensing circuit coupled in parallel to the power device between the first node and the second node, the sensing circuit operable to develop a signal indicative of the current flowing through the power device and further operable to be turned on and off by the same control signal as for the power device, wherein the sensing circuit turns on when the power device turns on and turns off when the power device turns off.

18. The power converter system of claim 17 comprising a synchronous rectifier coupled to the power device at the second node.

19. The power convener system of claim 17, wherein the sensing circuit comprises:

a first switching device coupled between the first node and a third node, wherein the first switching device remains turned on during operation of the power converter system; and a second switching device coupled in series with the first switching device between the third node and the second node, the second switching device turned on and off by the same control signal as for the switching device.

20. The power converter system of claim 19, wherein the power device, the first switching device, and the second switching device are in triode mode when the power device and the sensing circuit are turned on.

21. The power converter system of claim 19, wherein a size ration between each of the first and second switching devices and the power device is predetermined.

22. The power converter system of claim 19, wherein the signal indicative of the current flowing through the power device comprises a current flowing through the first and second switching devices.

23. The power converter system of claim 19, wherein the power device and the sensing circuit are implemented on an integrated circuit device.

24. The power converter system of claim 19, wherein the sensing circuit comprises a switching device, wherein a size ration between the switching device of the sensing circuit and the power device is predetermined.

25. The power converter system of claim 24, wherein the power device and the switching device are geometrically matched.

* * * * *